(12) United States Patent
Tsai et al.

(10) Patent No.: US 8,976,581 B2
(45) Date of Patent: Mar. 10, 2015

(54) NON-VOLATILE MEMORY CAPABLE OF PROGRAMMING CELLS BY HOT CARRIER INJECTION BASED ON A THRESHOLD VOLTAGE OF A CONTROL CELL

(71) Applicant: MACRONIX International Co., Ltd., Hsin-Chu (TW)

(72) Inventors: Wen Jer Tsai, Hualien County (TW); Ping Hung Tsai, Taoyuan County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 77 days.

(21) Appl. No.: 13/855,490

(22) Filed: Apr. 2, 2013

(65) Prior Publication Data
US 2014/0269076 A1     Sep. 18, 2014

Related U.S. Application Data

(60) Provisional application No. 61/780,887, filed on Mar. 13, 2013.

(51) Int. Cl.
*G11C 16/10*    (2006.01)

(52) U.S. Cl.
CPC ..................... *G11C 16/10* (2013.01)
USPC ............ 365/185.02; 365/185.17; 365/185.12; 365/185.22

(58) Field of Classification Search
USPC ............ 365/185.17, 185.02, 185.12, 185.13, 365/185.22
See application file for complete search history.

(56) References Cited

U.S. PATENT DOCUMENTS

| | | | | |
|---|---|---|---|---|
| 6,980,473 | B1 * | 12/2005 | Bautista et al. | 365/189.16 |
| 7,283,391 | B2 * | 10/2007 | Ueda et al. | 365/185.15 |
| 2009/0251962 | A1 * | 10/2009 | Yun et al. | 365/185.02 |
| 2011/0038203 | A1 * | 2/2011 | Camp et al. | 365/185.02 |

* cited by examiner

*Primary Examiner* — Andrew Q Tran
(74) *Attorney, Agent, or Firm* — J.C. Patents

(57) ABSTRACT

A non-volatile memory system includes a bit line and a plurality of memory cells associated with the bit line and coupled in a serial manner. The system further has a control circuitry in communication with the memory cells, wherein the control circuitry programs a target cell selected from the memory cells by applying a bit line voltage on the bit line in order to promote hot carrier injection into the target cell. The circuit also applies a programming voltage on the target cell under a hot carrier injection mechanism. Moreover, the circuit also applies a control voltage on a control cell, which is adjacent to the target cell when programming the target cell, wherein the control voltage is dependent on the threshold voltage of the control cell and the control voltage is less than the programming voltage.

18 Claims, 12 Drawing Sheets

NON-VOLATILE MEMORY CAPABLE OF PROGRAMMING CELLS BY HOT CARRIER INJECTION BASED ON A THRESHOLD VOLTAGE OF A CONTROL CELL

CROSS-REFERENCE TO RELATED APPLICATION

This application claims the priority benefit of U.S. provisional application Ser. No. 61/780,887, filed on Mar. 13, 2013. The entirety of the above-mentioned patent application is hereby incorporated by reference herein and made a part of this specification.

FIELD OF THE INVENTION

The present invention relates in general to a method of programming a non-volatile memory, and in particular, for a flash memory.

BACKGROUND

A hot carrier injection is a mechanism adopted for programming a non-volatile memory. It is usually to elevate the lateral channel electric field to a high order, such as over $10^5$ V/cm, to invoke a hot carrier injection. A conventional hot carrier injection programming method is illustrated in FIG. 1 to provide a better understanding of said method. FIG. 1 shows a memory string with several memory cells connected in a serial mode. Doped regions 14 and 16 are arranged on the ends and coupled to MOS switches 12 and 11, respectively. To conduct the hot carrier injection programming of the selected cell 10, the doped region 14 should receive a channel voltage that is greater than the ground voltage, whereas the doped region 16 is preferably set to ground level. Both MOS switches 11 and 12 are turned on and other cells are biased with a pass voltage; hence, a potential difference may form in the buried channel. A programming voltage is applied on the gate of the selected cell 10 in order to have the hot carriers penetrate into the selected cell's 10 trapping layer. Devices that adopt the hot carrier injection mechanism receive a lower programming voltage as compared to F-N tunneling.

As shown in FIG. 1, generated hot carriers are supposed to enter the selected cell 10 when the programming voltage is applied on the control gate. However, as the geometric dimension shrinks rapidly, the distance between each cell may be shorter such that the hot carriers may pass the selected cell 10 and enter unexpected regions, such as its neighboring cell 18. Therefore, the overshooting hot carriers may cause disturbance to the cell 18 and perform unexpected programming.

SUMMARY OF THE INVENTION

A circuit and a program scheme in order to mitigate disturbance to an adjacent cell while programming a target cell in a memory string under a hot carrier injection mechanism are provided. Generally, the adjacent cell is on the side of a string select transistor which is configured as a switch coupled to the bit line. A control voltage is applied on the adjacent cell according to the threshold voltage of the adjacent cell.

In an embodiment, a non-volatile memory system includes a bit line and a plurality of memory cells associated with the bit line and coupled in a serial manner. The system further has a control circuitry in communication with the memory cells, wherein the control circuitry programs a target cell selected from the memory cells by applying a bit line voltage on the bit line to promote hot carrier injection into the target cell. The circuit also applies a programming voltage on the target cell under a hot carrier injection mechanism. Moreover, the circuit also applies a control voltage on a control cell, which is adjacent to the target cell while programming the target cell, wherein the control voltage is dependant on the threshold voltage of the control cell and the control voltage is less than the programming voltage.

In another embodiment, a non-volatile memory system includes a memory array. The memory array has a plurality of bit lines, and each bit line is coupled with a memory cell string, wherein a plurality of memory cells is connected in a serial manner. The memory system further has a control circuitry in communication with the memory array, wherein the control circuitry programs a plurality of target cells selected from the memory array. The circuitry applies a programming voltage on the target cells under a hot carrier injection mechanism, and also applies a control voltage on a control cell that is adjacent to the target cell, wherein the control voltage is dependant on the threshold voltage of the corresponding control cell and the control voltage is less than the programming voltage. The control circuitry can also verify each control cell's threshold voltage before programming the target cells, and categorize control cells into a first group and a second group.

BRIEF DESCRIPTION OF THE DRAWINGS

The invention will be described according to the appended drawings in which.

DETAILED DESCRIPTION OF THE INVENTION

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. As used herein, the term "or" is an inclusive "or" operator, and is equivalent to the term "and/or," unless the context clearly dictates otherwise. In addition, throughout the specification, the meaning of "a," "an," and "the" include plural references. The term "coupled" implies that the elements may be directly connected together or may be coupled through one or more intervening elements.

Figure 1:
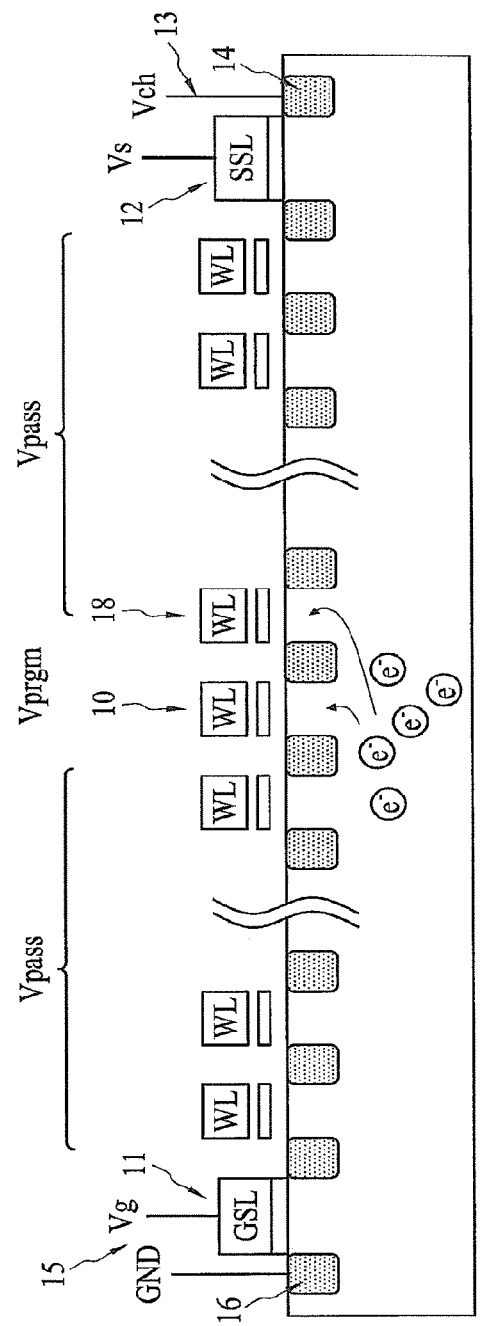
FIG. 1 is a conventional method to program a non-volatile memory string.
Figure 2:
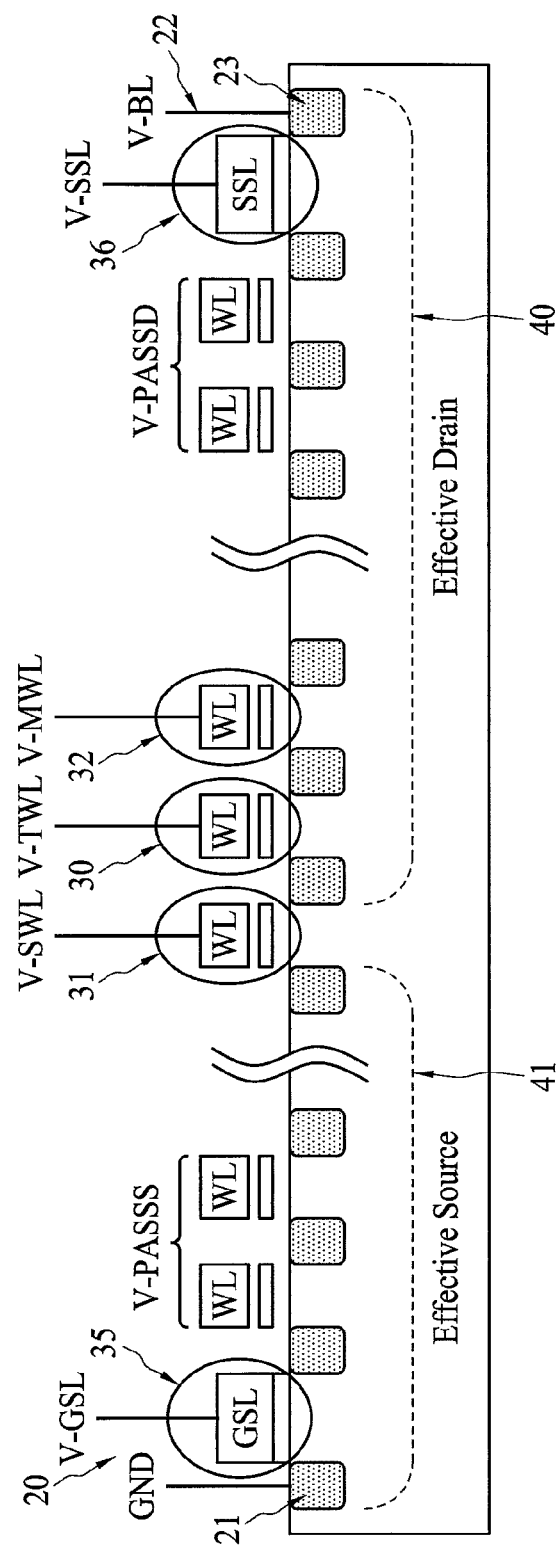
FIG. 2 is a cross-sectional view illustrating a method to program a non-volatile memory string according to one embodiment.

FIG. 2 shows an illustrative cross-sectional view of a NAND flash memory cell string and programming bias via hot carrier injection. It is noted that for n-channel embodiments, the substrate is p-type and the hot carriers include electrons. As for p-channel embodiments, the substrate is n-type and the hot carriers include holes. N-channel embodiments are used as examples in the description herein. On one end of the NAND string, a first switch 35 is formed by a MOS transistor having a gate coupled with a ground select line GSL and a contact 21 that is formed by an n-type region in the substrate. The contact 21 is connected to a common source line 20. On the other end of the NAND string, a second switch 36 is formed by a MOS transistor having a gate coupled with a string select line SSL and a contact 23 that is formed by an n-type region in the substrate. The contact 23 is connected to a bit line 22. The second switch 36 is also called the string select transistor of the bit line 22.

A cell 30 in the NAND string is selected as the cell to be programmed and is also called a target cell herein. The word line coupled with the target cell 30 receives a programming voltage V-TWL. The word line is coupled with a cell 31, which is adjacent to the target cell 30 on the side of the common source line 20 that receives a switching voltage V-SWL, which is designed to cause conditions for an efficient hot carrier injection during a portion of a program interval. The word line coupled with a cell 32 (control cell) adjacent to the target cell 30 on the side of the bit line 22 receives a pass voltage V-MWL, which is designed to mitigate the hot carriers penetrating into the control cell 32, while programming the target cell 30. The bit line 22 is biased to a bit line voltage V-BL, such as VD-PRGM, and the second switch 36 receives a pass voltage V-SSL. The word lines coupled with memory cells between the control cell 32 and the second switch 36 respectively, receive a pass voltage V-PAS SD in order to pre-charge the region 40 to a drain voltage VD-PRGM. The word lines coupled with memory cells between the switch cell 31 and the first switch 35 respectively, receive a pass voltage V-PASSS in order to pre-charge the region 41 to an effective source voltage VS-PRGM, while the common source line 20 is coupled to ground level and the first switch 35 is coupled to V-GSL. V-PASSD and V-PASSS may be the same or different as configured for a particular or specific programming condition. The pass voltage V-MWL applied on the control cell 32 is dependent on the threshold voltage VT of the control cell 32. Typically, the pass voltage V-MWL should be greater than the sum of its threshold voltage VT and the bit line voltage VD-PRGM in order to transfer the bit line voltage for supporting programming of the target cell at a desired speed. In another embodiment, while meeting the requirement of surpassing the sum of VT and the bit line voltage VD-PRGM, the pass voltage V-MWL applied on the control cell 32 also needs to be less than the V-PASSD, V-PASSS, and V-TWL in order to mitigate the program disturbance while programming the target cell 30. The switching voltage V-SWL is selected to manipulate the channel potential underneath the switch cell 31 during the program interval. In some particular embodiments, the bias applied on the control cell 32 may range from ½ to ⅔ of the programming voltage V-TWL.

When programming the target cell 30 in one embodiment, the bit line voltage V-BL may, for example, range from 3V to 4.5V. The V-PASSD and V-PASSS may range from 8V to 12V. The programming voltage V-TWL applied on the target cell 30 may range from 8V to 12V. The control voltage applied on the control cell V-MWL may range from 4V to 8V.

Figure 3:
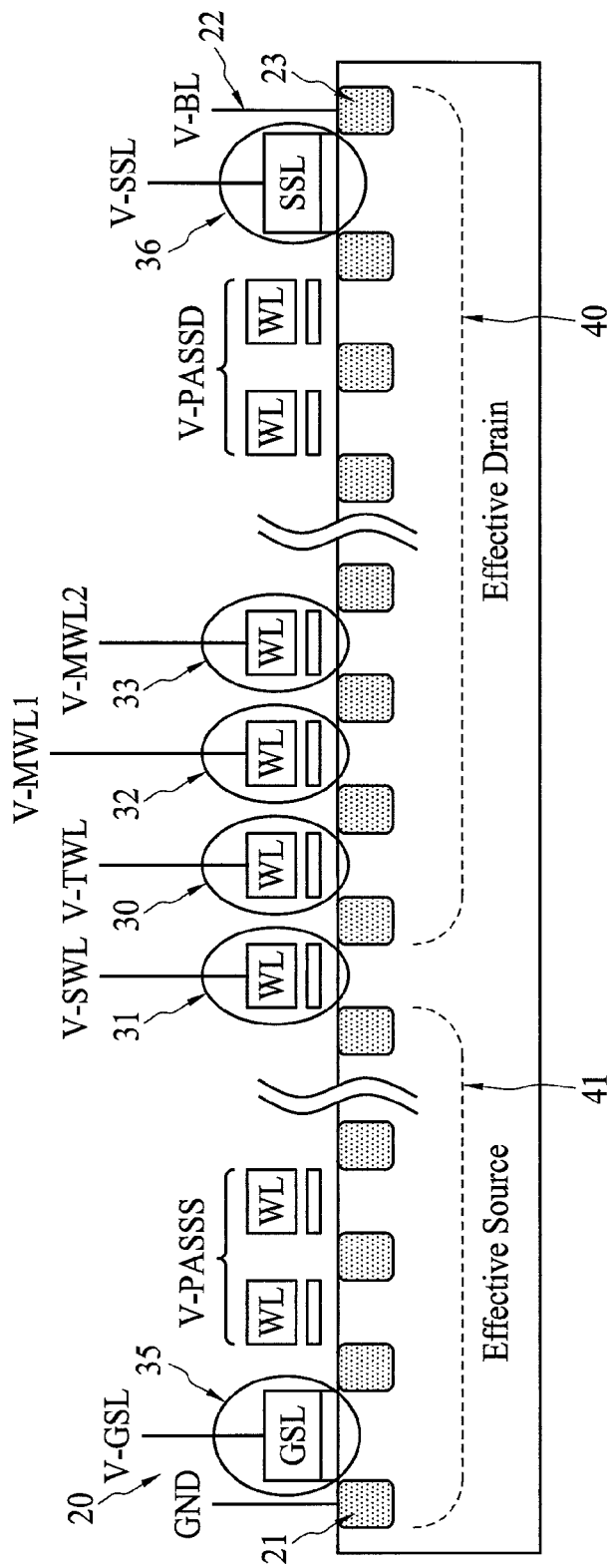
FIG. 3 is a cross-sectional view illustrating a method to program a non-volatile memory string according to one embodiment.

In case a portion of the hot carriers pass the control cell 32 to disturb the next adjacent cell 33, the next adjacent cell 33 is utilized to reduce the interference. FIG. 3 illustrates another embodiment wherein the word line coupled with the first control cell 32 receives a first pass voltage V-MWL 1, and the word line coupled with the second control cell 33 receives a second pass voltage V-MWL2. The first pass voltage V-MWL1 and the second pass voltage V-MWL2 may be the same or different, more specifically, they can be manipulated in an independent manner. However, the value of V-MWL2 is only allowed to be within the same range as defined for V-MWL1 in the aforementioned embodiments. In some particular embodiments, V-MWL2 is greater than V-MWL1. In some embodiments, there are more than two cells adjacent to the target cell 30 arranged to act as the control cells. During the programming interval, each control cell receives a control voltage respectively, which is greater than the sum of its threshold voltage and the bit line voltage VD-PRGM.

Figure 4:
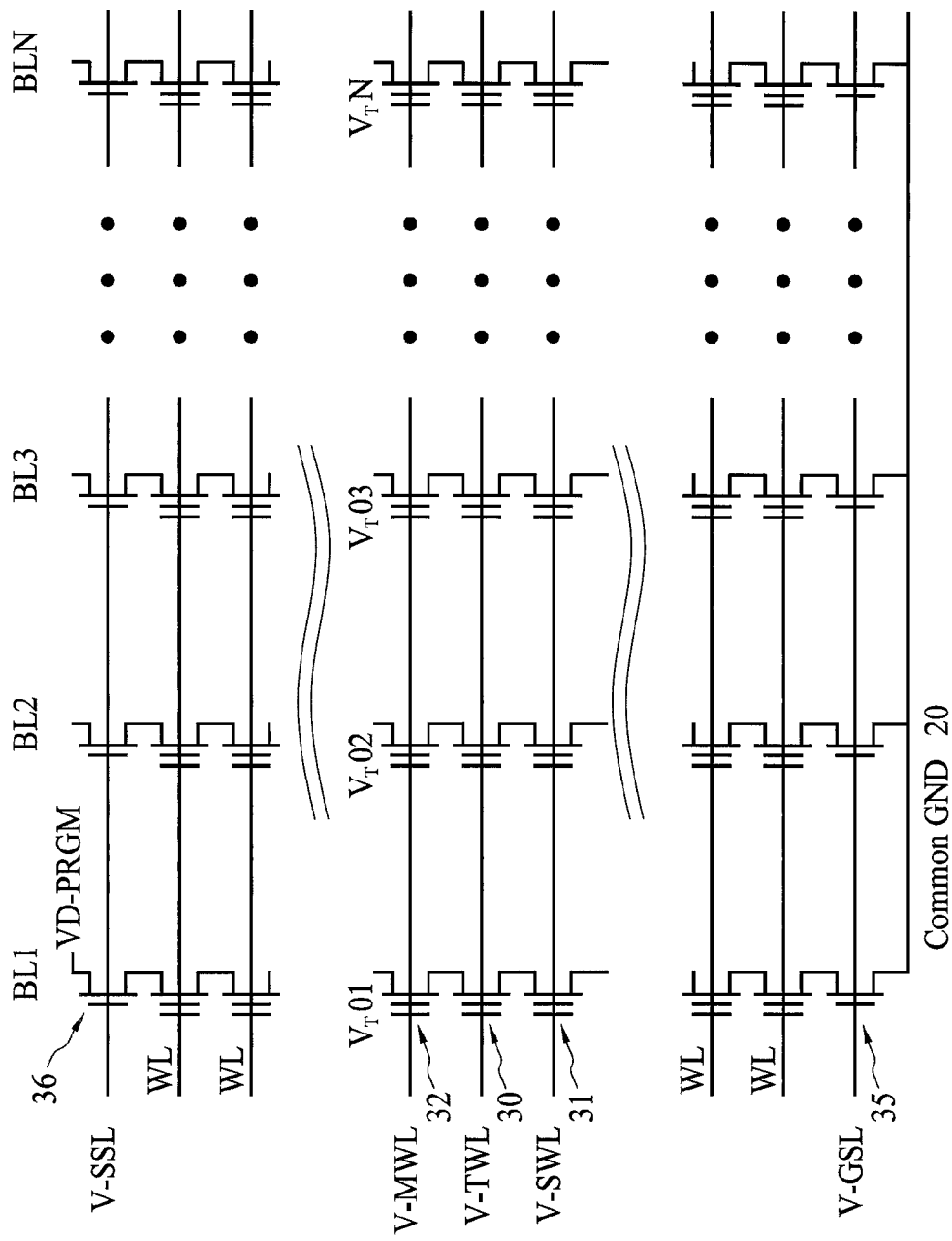
FIG. 4 is a circuit diagram illustrating a method to program a non-volatile memory string according to one embodiment.

FIG. 4 illustrates a circuit schematic of a NAND array having a plurality of memory strings coupled to a bit line BL1 to BLN and to a common ground line 20, respectively. Each word line is coupled to the gate of the corresponding memory cell on each bit line. During a programming interval, the target cell word line receives a programming voltage V-TWL. The switching word line adjacent to the target word line receives a switching voltage V-SWL to lead the hot carrier injection into the target cell. Generally, the V-SWL is within a range to optimize the performance, wherein the range is determined by the threshold voltage distribution of the memory cells coupled to the switch word line. In some particular embodiments, the V-SWL may range from a low limit VL, which is less than the lowest threshold voltage in the distribution, to a high limit VH, which is greater than the highest threshold voltage in the distribution. To input the switching voltage V-SWL can be in a ramp manner, which has the magnitude changing dynamically during the programming interval. The waveform may vary according to the preference; it can be in a sine, triangle, sawtooth and so on.

Figure 5:
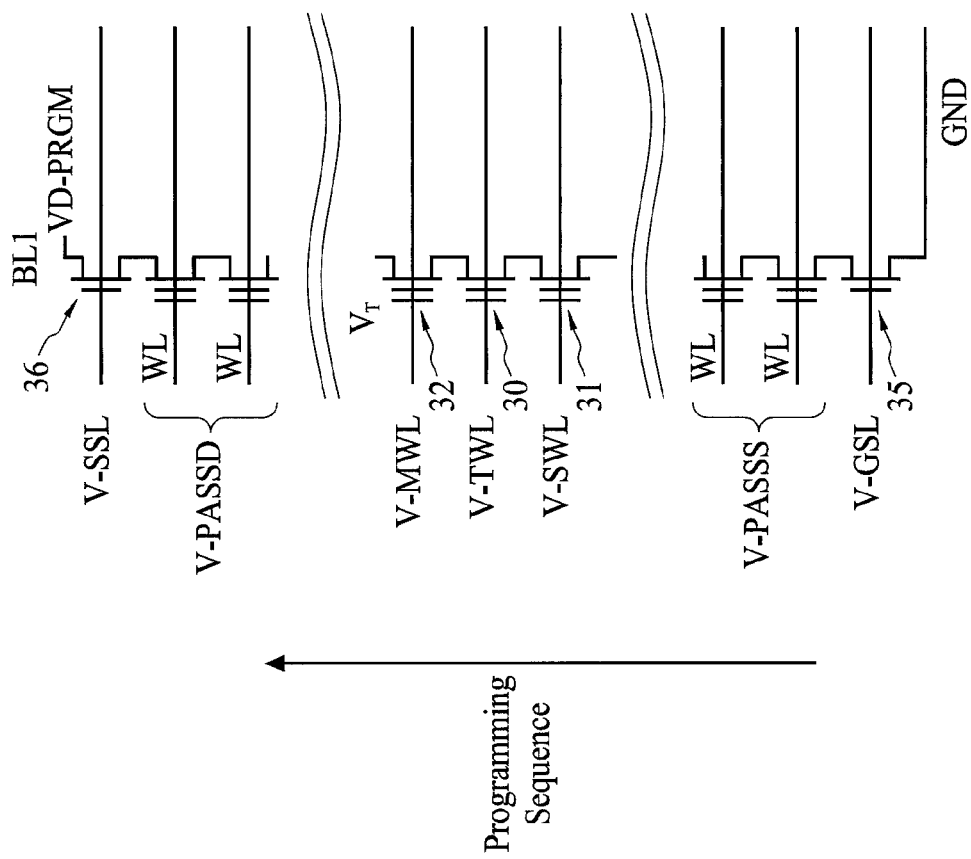
FIG. 5 is a circuit diagram illustrating a method to program a non-volatile memory string from GSL to SSL according to one embodiment.

A method to program the memory string is also dependent on the programming sequence and FIG. 5, as an example, is used to illustrate how to program a memory string from GSL to SSL. Since the target cell 30 is programmed before the cells between the target cell 30 and the SSL, the control cell 32 is unprogrammed and at a low state threshold voltage. While programming the target cell 30 with a hot carrier injection by applying a voltage V-TWL on the target word line, the word line coupled to the control cell 32 receives a pass voltage V-MWL, which is greater than the sum of the control cell's threshold voltage and the bit line voltage VD-PRGM. Furthermore, in order to mitigate the hot carriers from disturbing the control cell 32, the pass voltage V-MWL should also be less than the pass voltage on other cells (i.e. V-MWL is less than V-PASSD, V-PASSS, and V-TWL). In one embodiment, the control cell's threshold voltage is less than −1.0V, the VD-PRGM may range from 3V to 4.5V, the V-TWL may range from 8V to 12V, and the V-MWL may range from 4V to 8V.

Figure 6:
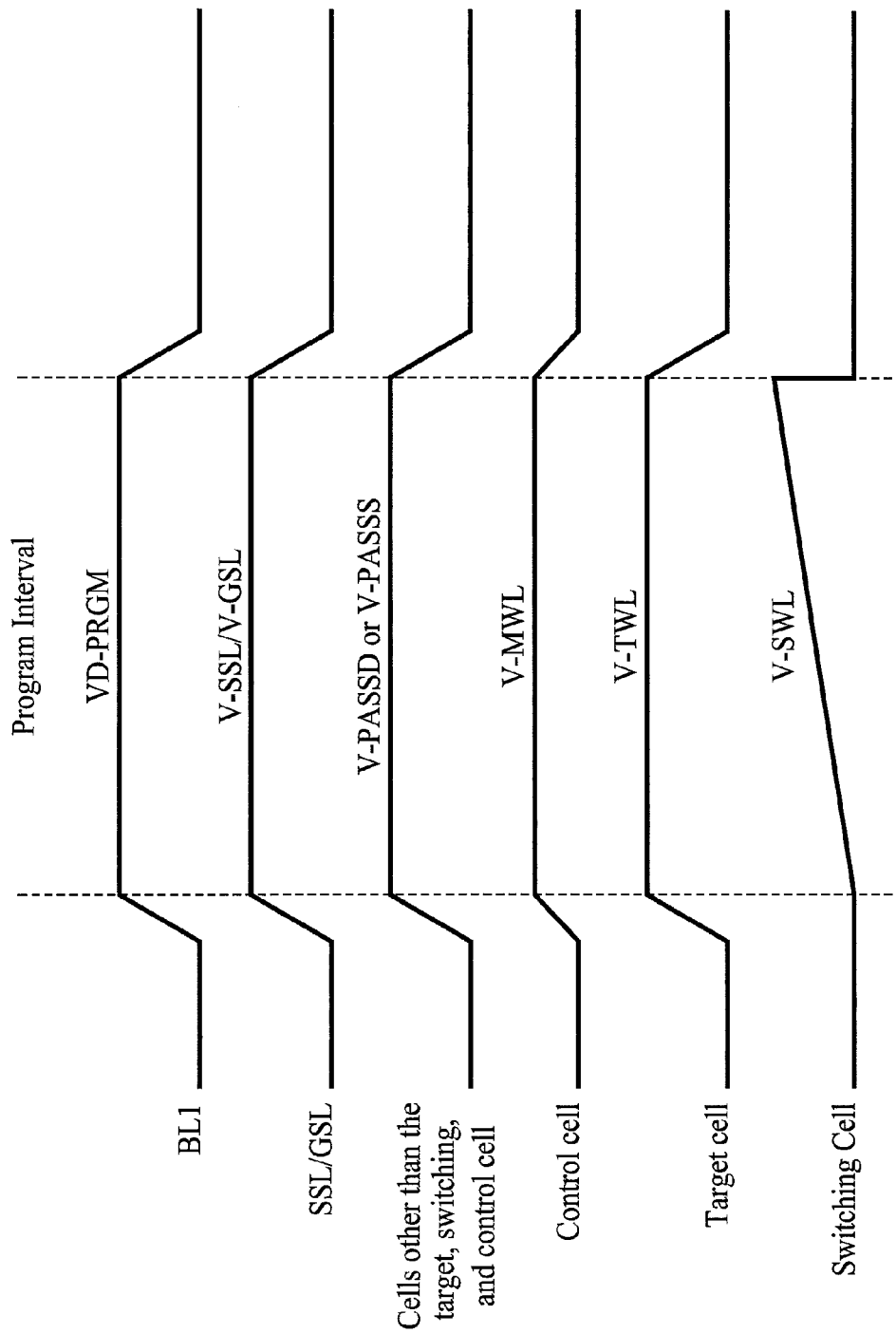
FIG. 6 is a sequence diagram illustrating a method to program a non-volatile memory string according to one embodiment.

FIG. 6 is a sequence diagram for one example of the bias voltages in connection with the operation described with reference to FIG. 5. The selected bit line BL1 is biased to a voltage state of VD-PRGM during the program interval. The word line coupled to the target cell 30 receives a program voltage V-TWL while the word line coupled to the switching cell 31 receives a triangle waveform switching voltage V-SWL. A pass voltage V-MWL, which is less than the V-PASSD or V-PASSS, is applied on the control cell 32 to mitigate the hot carrier disturbance.

Figure 7:
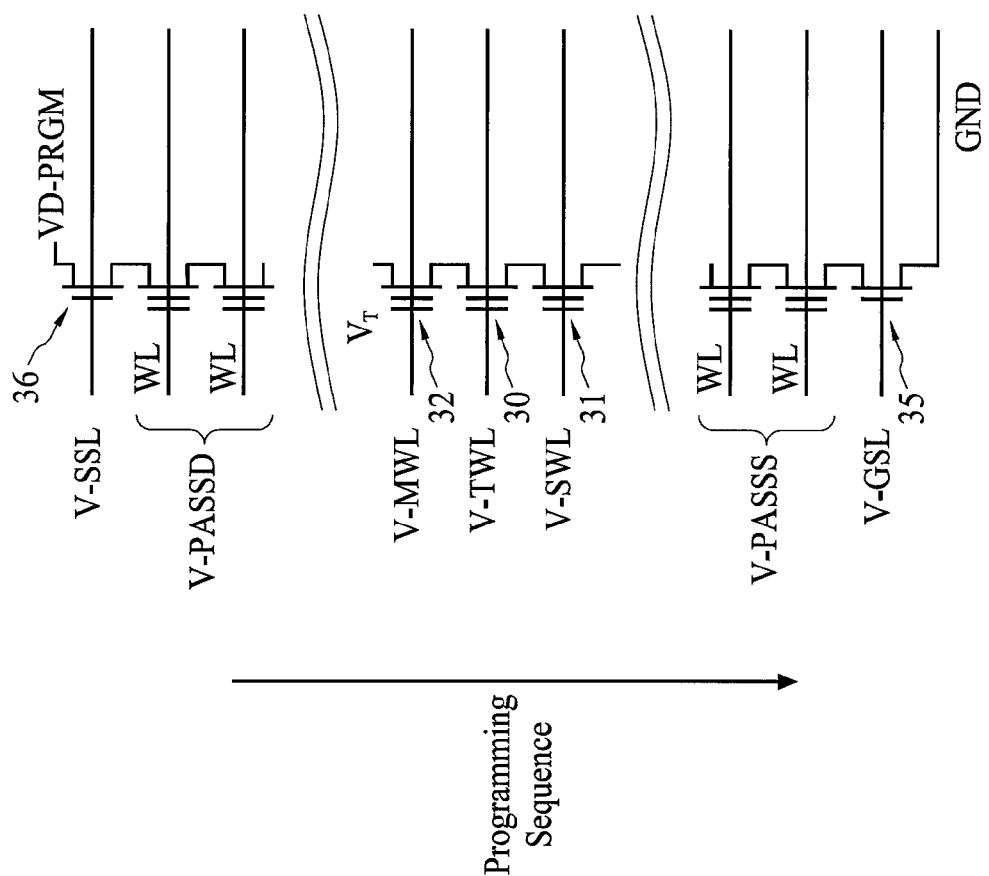
FIG. 7 is a circuit diagram illustrating a method to program a non-volatile memory string from SSL to GSL according to one embodiment.

FIG. 7 is used as an example to illustrate how to program a memory string from SSL to GSL. Since the target cell 30 is programmed after the cells between the target cell 30 and the SSL, the threshold voltage VT of the control cell 32 may have two different voltage levels: a high voltage level which means the control cell 32 has been programmed, or a low voltage level which means the control cell 32 is unprogrammed. A so-called bit pattern effect occurs if the control cell 32 is at the high voltage level. While programming the target cell 30 with a hot carrier injection by applying a programming voltage V-TWL on the target word line, a two-stage programming algorithm may be applied to the memory string. During the first stage, the word line coupled to the control cell 32 receives a low pass voltage V-MWL, which is greater than the sum of the control cell's threshold voltage and the bit line voltage VD-PRGM. Furthermore, in order to mitigate the hot carriers from disturbing the control cell 32, the pass voltage V-MWL should also be less than the pass voltage on the other cells (i.e. V-MWL is less than V-PASSD, V-PASSS, and V-TWL). Therefore, the target cell 30 can be programmed effectively if its adjacent control cell 32 is not programmed. In one embodiment, the control cell's unprogrammed threshold voltage is less than −1.0V, the VD-PRGM may range from 3V to 4.5V, the V-TWL may range from 8V to 12V, and the V-MWL may range from 4V to 8V.

As otherwise, if the adjacent control cell has been programmed before the target cell, then at the second stage, the word line coupled to the control cell 32 receives a higher pass voltage V-MWL, which is greater than the sum of the control cell's programmed threshold voltage and the bit line voltage VD-PRGM in order to promote the hot carrier injection programming on the target cell 30. However, since the control cell has been programmed, there is no concern to set a higher limit to the control voltage in order to mitigate the disturbance. In one embodiment, the programmed control cell's threshold voltage is greater than 2V, the VD-PRGM may range from 3V to 4.5V, the V-TWL may range from 8V to 12V, and the V-MWL may range from 8V to 12V.

The concept of the abovementioned two-stage SSL to GSL programming scheme can be expanded to a memory string as illustrated in FIG. 3, which is designed to have more than one control cell. While there are two control cells 32 and 33 adjacent to the target cell 30, a four-stage programming algorithm may be applied to the word line coupled to the control cells 32 and 33, respectively, according to the combination of each control cell's threshold voltage level. If there are n control cells selected, a $2^n$-stage programming algorithm may be applied to ensure having an effective programming process at a minimum disturbance.

Figure 8:
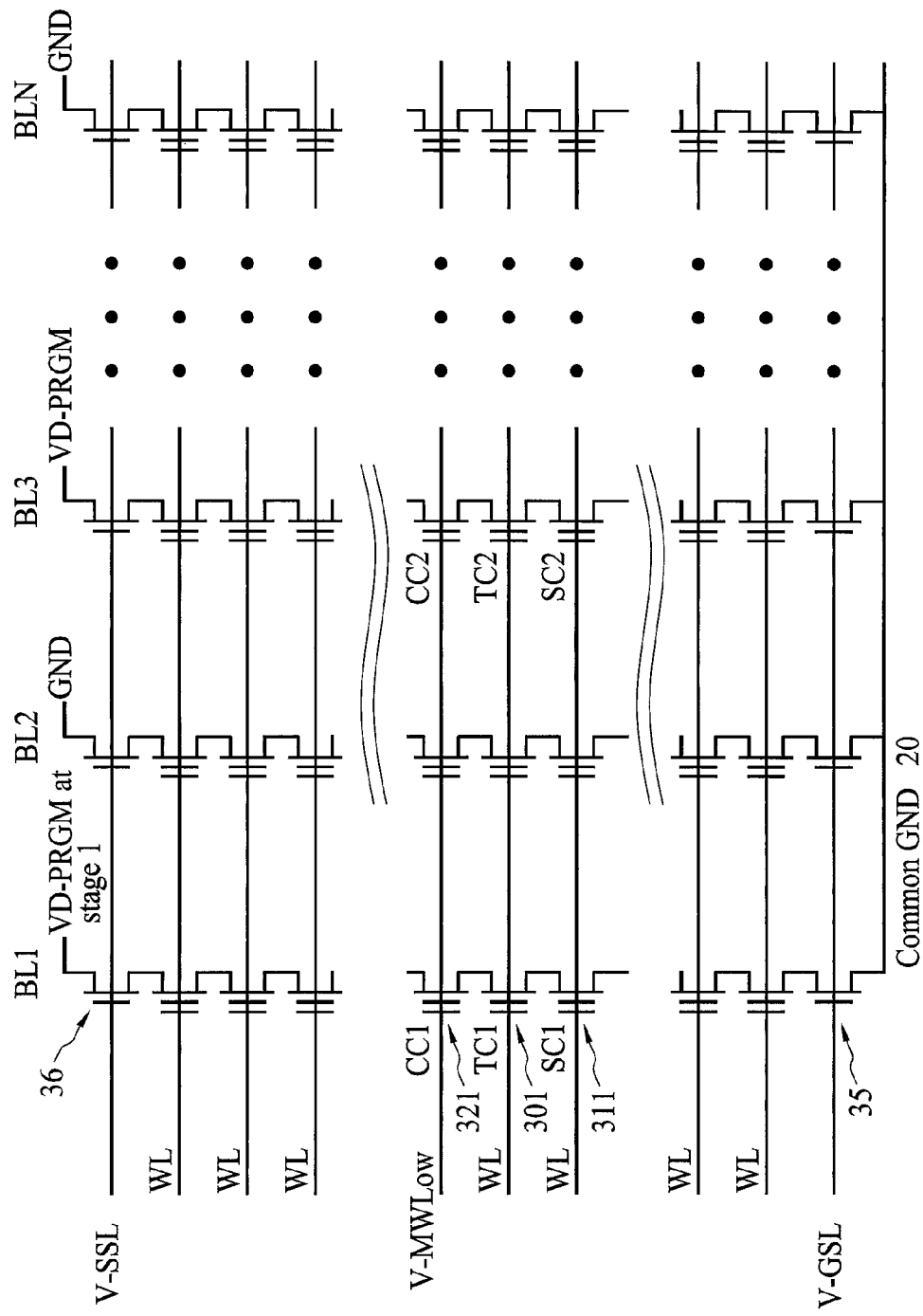
FIG. 8 is a circuit diagram illustrating a method to program a non-volatile memory string according to one embodiment.

FIG. 8 illustrates another embodiment of a memory array having a plurality of memory strings and a plurality of target cells which are programmed with a hot carry injection. The bit line BL1 and BL3 respectively, has a target cell TC1 and TC2 arranged to be programmed, and the bit line voltage is biased to VD-PRGM in order to elevate the channel potential under the memory cells in the string. For other non-programmed bit lines, low voltage such as ground voltage can be applied to inhibit the programming. As designed, each target cell has an adjacent control cell, wherein CC1 is the neighboring control cell of target cell TC1 and CC2 is the neighboring control cell of target cell TC2. Moreover, each target cell also has an adjacent switching cell on the other side, such as SC1. SC1 is the neighboring switching cell of the target cell TC1 and SC2 is the neighboring switching cell of the target cell TC2. In the present embodiment, the programming sequence is from SSL to GSL, hence the threshold voltage level of CC1 and CC2 may be in a high or low state according to the program. To simplify the description, in the following examples, CC1 is set as a non-programmed cell that has a low threshold voltage VT-L and CC2 is set as a programmed cell that has a high threshold voltage VT-H.

Figure 9:
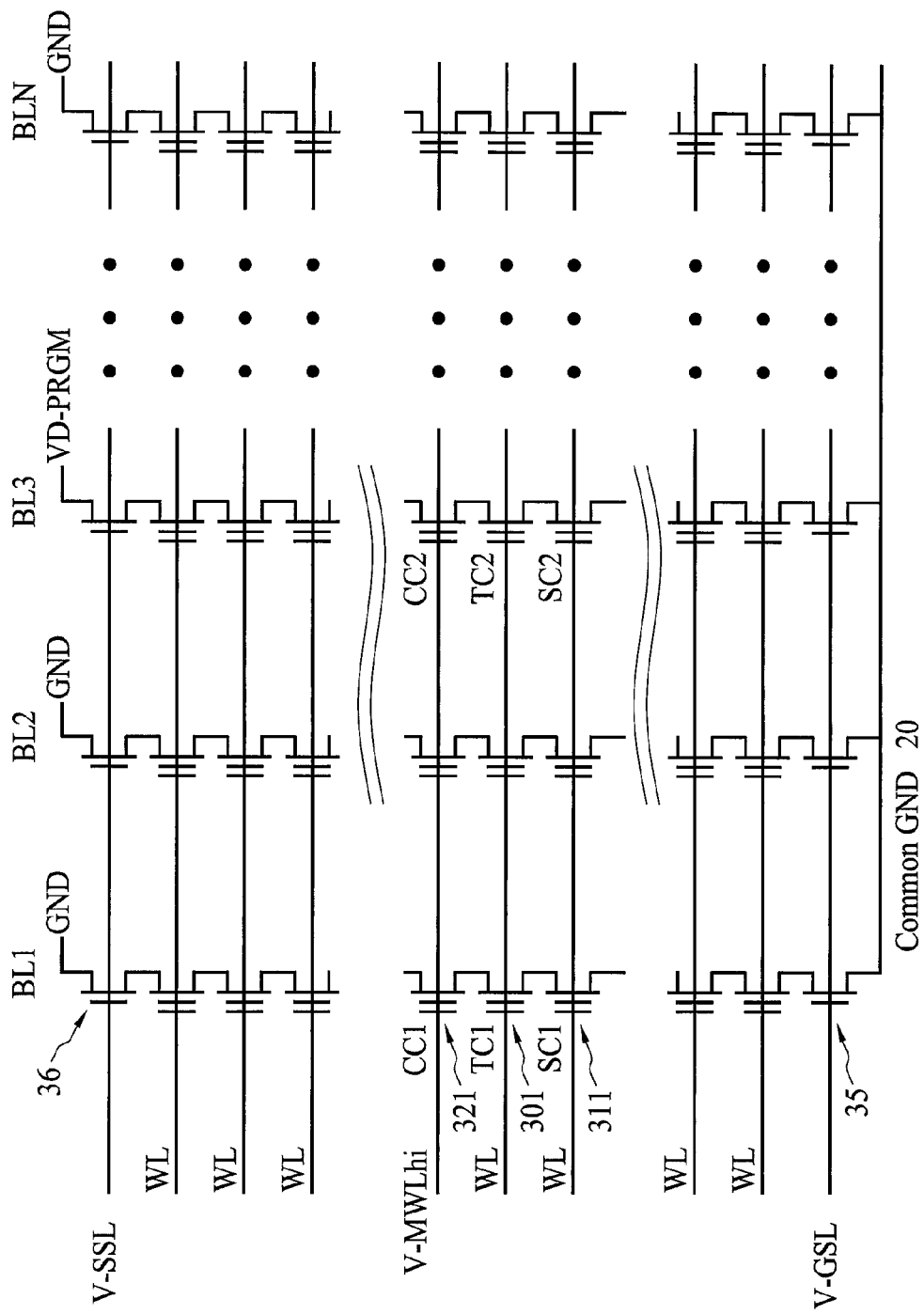
FIG. 9 is a circuit diagram illustrating a method to program a non-volatile memory string according to one embodiment.

The above mentioned multi-stage algorithm is applied to program the flash array by introducing a first stage to have each word line coupled to a control cell respectively receive a low pass voltage V-MWLow which is greater than the sum of VT-L and the bit line voltage VD-PRGM. Furthermore, in order to mitigate the hot carriers from disturbing the control cell CC1, the pass voltage V-MWLow should also be less than the pass voltage on the other cells (i.e. V-MWLow is less than V-PASSD, V-PASSS, and V-TWL). Therefore, the target cell TC1 can be programmed effectively without affecting the unprogrammed control cell CC1. However, since the second control cell CC2 is at a high level state, the applied low pass voltage V-MWLow is not high enough to turn on the channel of the control cell CC2 in order to promote the programming on its neighboring target cell TC2. The method can further include a step to verify whether the target cells have been programmed. FIG. 9 shows a second stage programming introduced after the verification, wherein a high pass voltage V-MWLhi is applied to the word line coupled to the control cell CC2. During this stage, the bit line BL1 is grounded in order to inhibit the programmed target cell TC1 but BL3 is still biased to VD-PRGM. The high pass voltage V-MWLhi is greater than the sum of VT-H and the bit line voltage VD-PRGM. Therefore, the target cell TC2 can be effectively programmed while no disturbance occurs on the prior programmed target cell TC1 since the associated bit line is grounded. The same methodology can apply to an array which may have more than two target word lines during the program interval.

Figure 10:
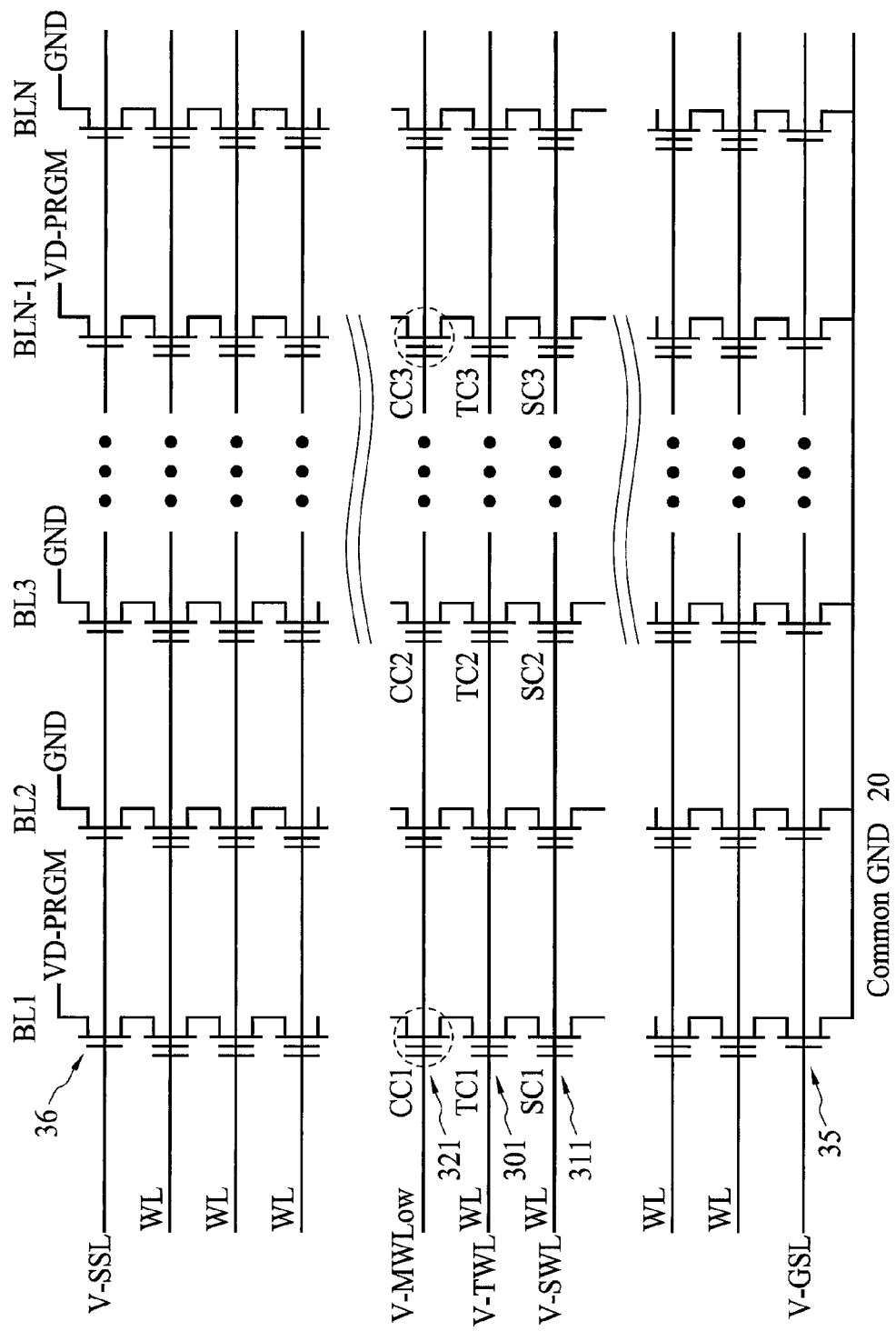
FIG. 10 is a circuit diagram illustrating a method to program a non-volatile memory string according to one embodiment.
Figure 11:
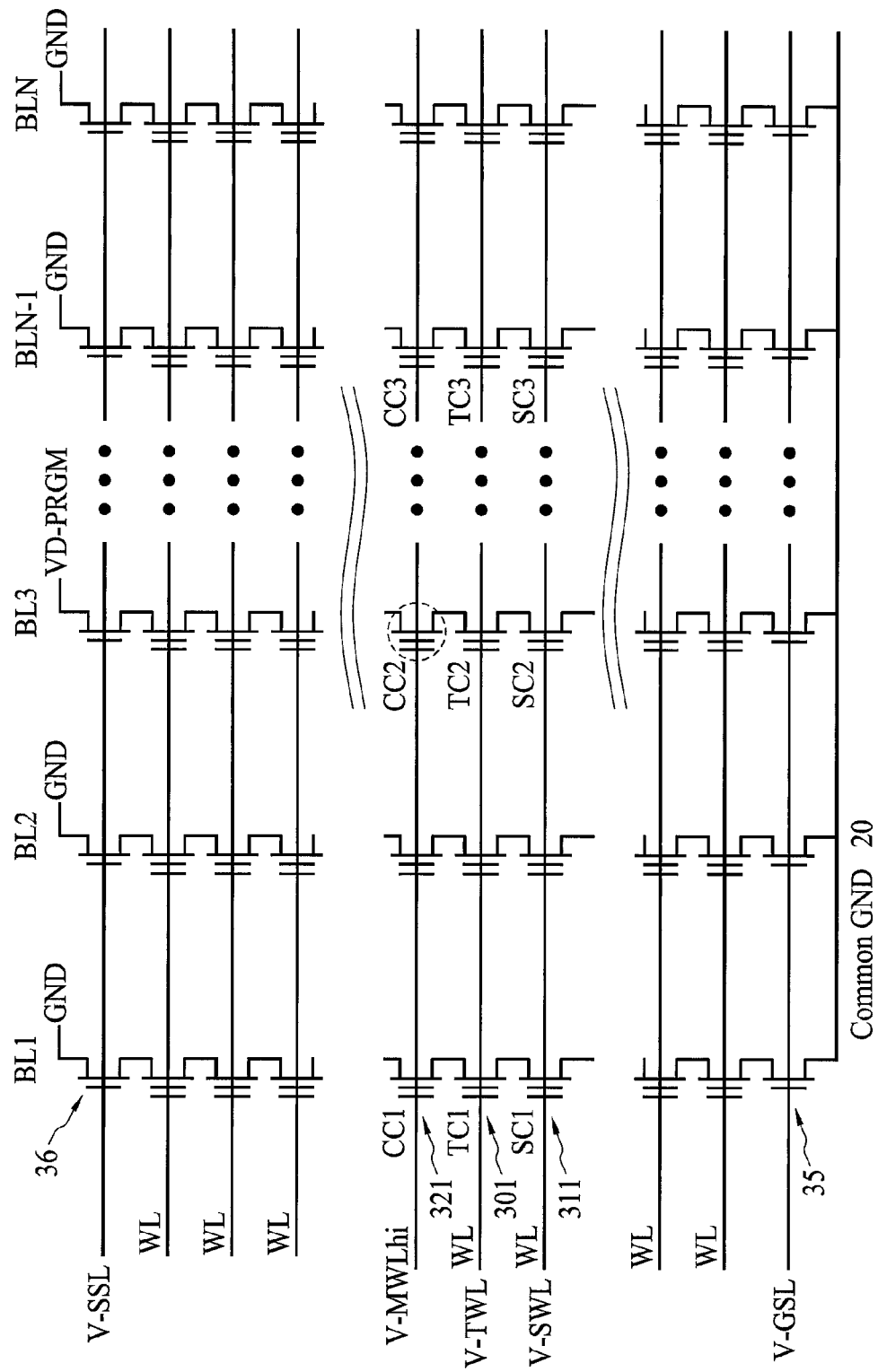
FIG. 11 is a circuit diagram illustrating a method to program a non-volatile memory string according to one embodiment.

Another way to achieve an optimized programming speed for a target cell which is programmed from SSL to GSL without disturbing the neighboring cell in a flash memory array is illustrated in FIG. 10. In the first step, the programming method verifies the threshold voltage level of the corresponding control cell for each target cell. For example, if the control cells CC1 and CC3 are in a low threshold voltage level, which means both are unprogrammed, then TC1 and TC3 are categorized with other unprogrammed control cells into a first group. Meanwhile, a control cell that is verified to be at a high level, such as CC2 thereof, is categorized into a second group. During the first stage, as shown in FIG. 10, only the bit line coupled to the control cells in the first group, such as BL1 and BLN-1, is biased with a bit line voltage VD-PRGM for programming. The corresponding word line receives a low pass voltage V-MWLow which is greater than the sum of the control cell's unprogrammed threshold voltage and the bit line voltage VD-PRGM in order to mitigate the disturbance while a programming voltage V-TWL is applied on the target cell TC1 and TC3. In the present embodiment, since CC1 and CC3 are coupled to the same word line, the threshold voltage referred to determine the low pass voltage should be the highest of CC1 and CC3. After programming the target cell during the first stage, a second stage, as illustrated in FIG. 11, is further introduced to program the target cell which has a neighboring control cell with a programmed threshold voltage. During the second stage, except for the bit line coupled to the high level control cell, other bit lines are coupled at ground level to inhibit unexpected programming. BL3 is biased to a voltage VD-PRGM and a high pass voltage V-MWLhi is applied on the word line coupled to the control cell CC2. The high pass voltage V-MWLhi should be greater than the sum of the control cell's CC2 threshold voltage and the bit line voltage VD-PRGM to ensure the programming speed meets the requirement. Alternatively, since the bit line voltage is set to be at ground level while the corresponding target cell is not programmed, the sequence to introduce the first or the second programming stage is interchangeable. The target cell in the second group can be programmed in the front by applying a high pass voltage V-MWLhi on the control cell; hence, the target cell in the first group can be programmed later by applying a low pass voltage V-MWLow on the control cell.

Figure 12:
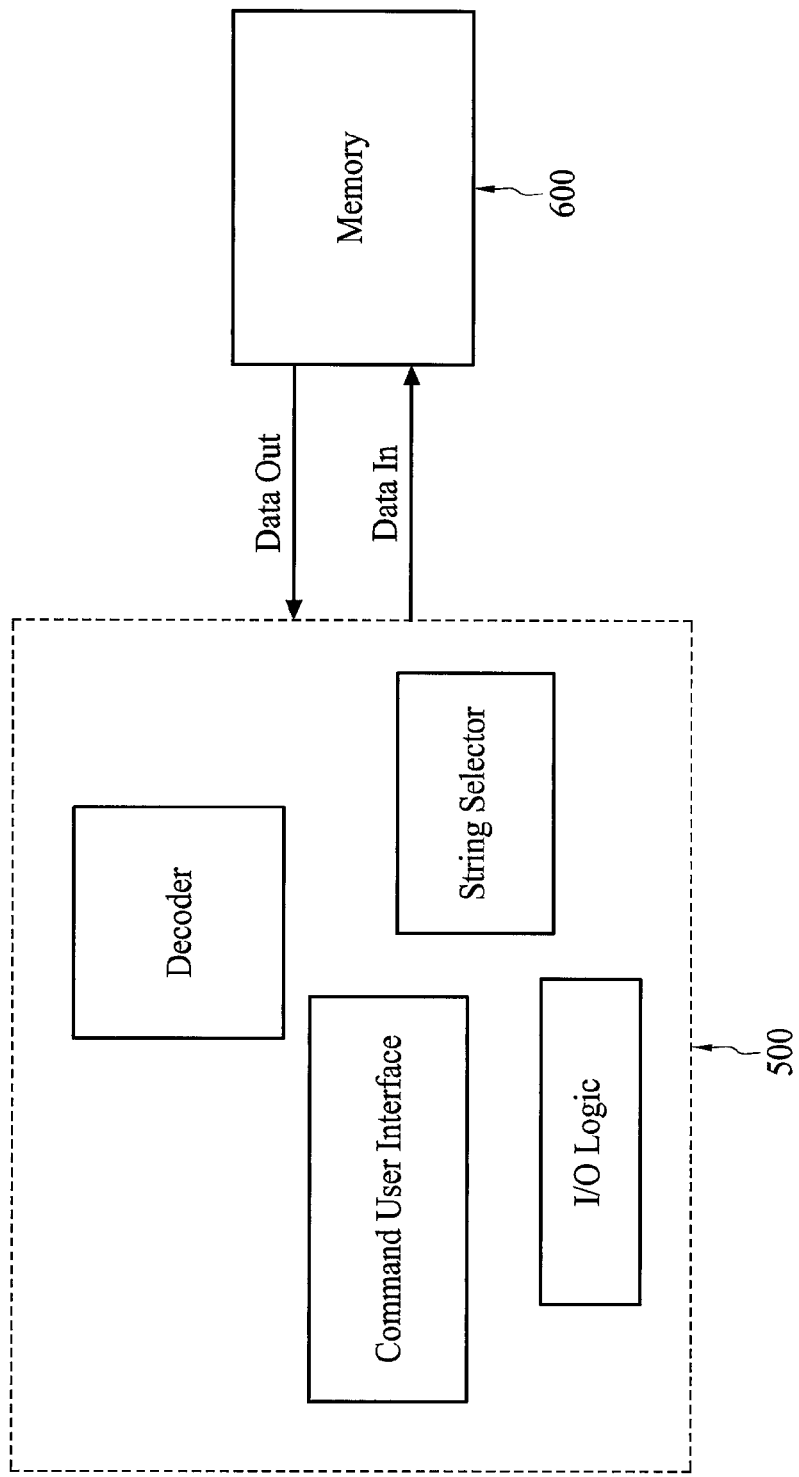
FIG. 12 is a simplified block diagram of one embodiment of a non-volatile memory system.

FIG. 12 is a simplified block diagram of one embodiment of a non-volatile memory system that can be used to implement the aforementioned methods. The diagram has a control circuitry 500 coupled with a memory 600. The memory 600 can be a NAND flash or other programmable non-volatile memory, which has a plurality of memory cells disposed therein. The control circuitry 500 is configured to communicate with the memory cells in the memory block 600 and arrange the memory storage. The control circuitry 500 can address the target cell in the memory block and the cells adjacent to the target cell. The word line and bit line are also selected by the control circuitry 500 and respectively receive a pre-determined voltage according to the program sequence. During the program interval, the adjacent cell on the side of the common source line is labeled by the circuitry 500 as a switching cell, on which a switching voltage V-SWL is applied in order to promote hot carrier programming on the target cell when the target cell is under a programming voltage V-TWL. Moreover, the adjacent cell on the side of the bit line is labeled by the circuitry 500 as a control cell. Besides the word lines coupled to the target cell, switching cell and control cell, the other word lines are given a pass voltage V-PASS which may differ from each other. The word line coupled to the control cell receives a control voltage V-MWL which needs to be greater than the sum of the control cell's threshold voltage and the bit line voltage VD-PRGM, wherein the bit line voltage VD-PRGM is set to promote hot carrier injection into the target cell. The control circuitry 500 can also verify the threshold voltage of the control cell before programming the target cell in order to determine a suitable control voltage applied on the control cell. In general, the control circuitry 500 is configured to be capable of programming the memory 600 in different fashions as described in the aforementioned embodiments as required.

The methods and features of this invention have been sufficiently described in the above examples and descriptions. It should be understood that any modifications or changes without departing from the spirit of the invention are intended to be covered in the protection scope of the invention.

What is claimed is:

1. A non-volatile memory system, comprising:
    a bit line;
    a plurality of memory cells associated with the bit line and coupled in a serial manner; and
    a control circuitry in communication with the memory cells, wherein the control circuitry programs a target cell selected from the memory cells by applying a bit line voltage on the bit line for promoting hot carrier injection into the target cell, and a programming voltage on the target cell under hot carrier injection mechanism, and applying a control voltage on a control cell, which is adjacent to the target cell while programming the target cell, wherein the control voltage is dependent on the threshold voltage of the control cell and the control voltage is less than the programming voltage.

2. The memory system of claim 1, wherein the control voltage is greater than the sum of the adjacent cell's threshold voltage and the bit line voltage.

3. The memory system of claim 1, further comprising a string select transistor coupled to the bit line, wherein the control cell is on the side of the string select transistor.

4. The memory system of claim 1, further comprising a switching cell adjacent to the target cell and being on the opposite side from the control cell, wherein the control circuitry applies a switching voltage on the switching cell to enhance a hot carrier injection into the target cell.

5. The memory system of claim 1, wherein the control circuitry further comprises a plurality of control cells adjacent to the target cell.

6. The memory system of claim 1, further comprising a plurality of pass word lines, wherein the pass word lines are coupled to the memory cells, and exclude the target cell, the control cell and the switching cell; and the control circuitry applies a pass voltage on each pass word line, wherein the pass voltage is greater than the control voltage.

7. The memory system of claim 1, wherein the control circuitry is configured to program the target cell by a two stage programming scheme, wherein the control circuitry applies a low control voltage, which is greater than the sum of the control cell's unprogrammed threshold voltage and the bit line voltage at the first stage, and applies a high control voltage, which is greater than the sum of the control cell's programmed threshold voltage and the bit line voltage at the second stage.

8. The memory system of claim 7, further comprising a plurality of pass word lines, wherein the pass word lines are coupled to the memory cells, and exclude the target cell, the control cell and the switching cell; and the control circuitry applies a pass voltage on each pass word line, wherein the pass voltage is greater than the control voltage at the first stage.

9. The memory system of claim 7, wherein the control circuitry further comprises a plurality of control cells adjacent to the target cell.

10. A non-volatile memory system, comprising:
    a memory array comprising a plurality of bit lines, wherein each bit line is coupled with a memory cell string comprising a plurality of memory cells connected in a serial manner; and
    a control circuitry in communication with the memory array, wherein the control circuitry programs a plurality of target cells selected from the memory array by applying a programming voltage on the target cells under a hot carrier injection mechanism and applying a control voltage on a corresponding control cell, which is adjacent to the respective target cell, wherein the control voltage is dependent on the threshold voltage of the corresponding control cell and the control voltage is less than the programming voltage.

11. The memory system of claim 10, wherein the control circuitry is configured to program the target cells by a two stage programming scheme, wherein the control circuitry applies a low control voltage which is greater than the sum of the control cell's unprogrammed threshold voltage and a bit line voltage applied on the corresponding bit line at the first stage, wherein the bit line voltage is configured to promote hot carrier injection into the target cell.

12. The memory system of claim 11, wherein the control circuitry is configured to apply a high control voltage which is greater than the sum of the control cell's programmed threshold voltage and the bit line voltage at the second stage, and the bit line corresponding to the target cell programmed in the first stage is coupled to a ground level.

13. The memory system of claim 10, wherein the control circuitry verifies each control cell's threshold voltage before programming the target cells and categorizes control cells into a first group and a second group.

14. The memory system of claim 13, wherein the control circuitry is configured to program the target cells by a two stage programming scheme, wherein the control circuitry applies a low control voltage on the control cell in the first group while programming the corresponding target cell, wherein the low control voltage is greater than the sum of the respective control cell's unprogrammed threshold voltage and a bit line voltage applied on the corresponding bit line during the present programming stage.

15. The memory system of claim 14, wherein the control circuitry is configured to inhibit other target cells while programming the target cell in the first group.

16. The memory system of claim 14, further comprising a plurality of pass word lines, wherein the control circuitry applies a pass voltage on each pass word line, wherein the pass voltage is greater than the low control voltage.

17. The memory system of claim 13, wherein the control circuitry is configured to program the target cells by a two stage programming scheme, wherein the control circuitry applies a high control voltage on the control cell in the second group while programming the corresponding target cell, wherein the high control voltage is greater than the sum of the respective control cell's programmed threshold voltage and a bit line voltage applied on the corresponding bit line during the present programming stage.

18. The memory system of claim 17, wherein the control circuitry is configured to inhibit other target cells while programming the target cell in the second group.

* * * * *